United States Patent
Cai et al.

(10) Patent No.: US 10,446,665 B2
(45) Date of Patent: Oct. 15, 2019

(54) METHOD AND STRUCTURE FOR PROTECTING GATES DURING EPITAXIAL GROWTH

(71) Applicant: GLOBALFOUNDRIES INC., Grand Cayman (KY)

(72) Inventors: Xiuyu Cai, Niskayuna, NY (US); Ying Hao Hsieh, Clifton Park, NY (US)

(73) Assignee: GLOBALFOUNDRIES INC., Grand Caymay (KY)

( * ) Notice: Subject to any disclaimer, the term of this patent is extended or adjusted under 35 U.S.C. 154(b) by 0 days.

(21) Appl. No.: 15/904,982

(22) Filed: Feb. 26, 2018

(65) Prior Publication Data
US 2018/0190787 A1 Jul. 5, 2018

Related U.S. Application Data (62) Division of application No. 14/309,096, filed on Jun. 19, 2014, now Pat. No. 9,941,388.

(51) Int. Cl.
*H01L 27/092* (2006.01)
*H01L 29/78* (2006.01)
(Continued)

(52) U.S. Cl.
CPC .. *H01L 29/6656* (2013.01); *H01L 21/823814* (2013.01); *H01L 21/823821* (2013.01);
(Continued)

(58) Field of Classification Search
CPC ..... H01L 21/823418; H01L 21/823468; H01L 21/823814; H01L 21/823864;
(Continued)

(56) References Cited

U.S. PATENT DOCUMENTS 5,015,598 A * 5/1991 Verhaar ............. H01L 21/28247
216/39
5,710,450 A * 1/1998 Chau ................... H01L 21/2254
257/19
(Continued)

FOREIGN PATENT DOCUMENTS

FR 3 060 850 * 6/2018 ............. H01L 29/72
WO 2006060528 A2 6/2006

OTHER PUBLICATIONS

Office Action dated Sep. 2, 2016 in U.S. Appl. No. 14/309,096; now issued as U.S. Pat. No. 9,941,388.
(Continued)

*Primary Examiner* — Mary A Wilczewski
(74) *Attorney, Agent, or Firm* — Williams Morgan, P.C.

(57) ABSTRACT

Embodiments of the present invention provide methods and structures for protecting gates during epitaxial growth. An inner spacer of a first material is deposited adjacent a transistor gate. An outer spacer of a different material is deposited adjacent the inner spacer. Stressor cavities are formed adjacent the transistor gate. The inner spacer is recessed, forming a divot. The divot is filled with a material to protect the transistor gate. The stressor cavities are then filled. As the gate is safely protected, unwanted epitaxial growth ("mouse ears") on the transistor gate is prevented.

14 Claims, 9 Drawing Sheets

(51) Int. Cl.
*H01L 29/51* (2006.01)
*H01L 29/66* (2006.01)
*H01L 21/8238* (2006.01)
*H01L 21/8234* (2006.01)
*H01L 29/165* (2006.01)

(52) U.S. Cl.
CPC .... *H01L 21/823864* (2013.01); *H01L 27/092* (2013.01); *H01L 29/6653* (2013.01); *H01L 29/66636* (2013.01); *H01L 29/66795* (2013.01); *H01L 29/7848* (2013.01); *H01L 21/823418* (2013.01); *H01L 21/823468* (2013.01); *H01L 29/165* (2013.01)

(58) Field of Classification Search
CPC ............. H01L 29/6653; H01L 29/6656; H01L 29/66636; H01L 29/7848
USPC ........................................................ 438/300
See application file for complete search history.

(56) References Cited

U.S. PATENT DOCUMENTS

| | | | | |
|---|---|---|---|---|
| 5,998,248 A * | 12/1999 | Ma | ...................... | H01L 21/2257 257/E21.151 |
| 5,998,273 A * | 12/1999 | Ma | ...................... | H01L 21/2257 257/E21.151 |
| 6,251,802 B1 * | 6/2001 | Moore | ................ | H01L 21/3146 257/E21.008 |
| 6,287,924 B1 * | 9/2001 | Chao | ................. | H01L 21/28052 257/E21.199 |
| 6,462,371 B1 * | 10/2002 | Weimer | ............ | H01L 21/02126 257/306 |
| 6,512,273 B1 * | 1/2003 | Krivokapic | ..... | H01L 21/823864 257/369 |
| 6,720,601 B2 * | 4/2004 | Terauchi | ........... | H01L 21/28052 257/296 |
| 6,753,242 B2 * | 6/2004 | Yeap | ................. | H01L 21/28273 257/E21.209 |
| 6,974,752 B2 * | 12/2005 | Jang | ................. | H01L 21/28247 257/288 |
| 7,033,895 B2 * | 4/2006 | Lee | ................... | H01L 29/42376 257/E21.409 |
| 7,064,071 B2 * | 6/2006 | Schwan | .......... | H01L 21/823864 257/E21.64 |
| 7,064,085 B2 * | 6/2006 | Chiu | ....................... | H01L 22/12 257/E21.53 |
| 7,067,881 B2 * | 6/2006 | Matsumoto | ....... | H01L 21/28052 257/347 |
| 7,176,110 B2 * | 2/2007 | van Bentum | ... | H01L 21/823418 257/E21.43 |
| 7,176,522 B2 * | 2/2007 | Cheng | ............. | H01L 21/823807 257/204 |
| 7,279,386 B2 * | 10/2007 | Kelling | ............ | H01L 21/28123 257/E21.024 |
| 7,354,838 B2 * | 4/2008 | Kammler | ........ | H01L 21/823807 257/E21.438 |
| 7,381,623 B1 * | 6/2008 | Chen | ............... | H01L 21/823412 257/E21.43 |
| 7,511,331 B2 * | 3/2009 | Anezaki | ............ | H01L 27/1052 257/315 |
| 7,618,856 B2 * | 11/2009 | Ting | ................ | H01L 21/823807 257/E21.634 |
| 7,732,288 B2 * | 6/2010 | Zhu | ................... | H01L 21/26506 257/347 |
| 7,745,296 B2 * | 6/2010 | van Meer | ......... | H01L 29/41783 438/299 |
| 7,932,143 B1 * | 4/2011 | Pal | ................... | H01L 21/28123 257/E21.616 |
| 7,989,296 B2 * | 8/2011 | Lee | ................... | H01L 29/66772 257/E21.43 |
| 8,003,470 B2 * | 8/2011 | Tews | ................... | H01L 29/6653 257/E21.431 |
| 8,106,467 B2 * | 1/2012 | Shima | ............. | H01L 21/823807 257/336 |
| 8,183,115 B2 * | 5/2012 | Ishigaki | .......... | H01L 21/823418 257/368 |
| 8,574,970 B2 * | 11/2013 | Cheng | ............... | H01L 29/66628 257/E21.619 |
| 8,592,911 B2 * | 11/2013 | Liang | ................ | H01L 21/28105 257/356 |
| 8,642,415 B2 * | 2/2014 | Adam | ................ | H01L 27/1203 438/163 |
| 8,644,068 B1 * | 2/2014 | Yang | ................... | G11C 11/5628 365/185.01 |
| 8,647,954 B2 * | 2/2014 | Alptekin | ........... | H01L 21/28518 438/300 |
| 8,652,914 B2 * | 2/2014 | Alptekin | .......... | H01L 21/28518 438/300 |
| 8,697,528 B2 * | 4/2014 | Dyer | ................ | H01L 21/30608 438/300 |
| 8,765,559 B2 * | 7/2014 | Kronholz | ........ | H01L 21/823814 257/E21.626 |
| 8,829,576 B2 * | 9/2014 | Zhu | ................... | H01L 29/66636 257/288 |
| 8,835,244 B2 * | 9/2014 | Xie | ................ | H01L 21/823437 257/310 |
| 8,835,995 B2 * | 9/2014 | Kang | ................... | H01L 21/0245 257/288 |
| 8,847,315 B2 * | 9/2014 | Yang | ................... | H01L 27/1211 257/347 |
| 8,900,956 B2 * | 12/2014 | Chung | ............ | H01L 21/823807 438/230 |
| 8,900,957 B2 * | 12/2014 | Chung | ............ | H01L 21/823807 438/230 |
| 8,932,930 B2 * | 1/2015 | Beyer | ............... | H01L 21/28123 257/E21.409 |
| 8,987,860 B2 * | 3/2015 | Song | ................... | H01L 29/0649 257/499 |
| 9,252,235 B2 * | 2/2016 | Roh | ................ | H01L 21/823412 |
| 9,349,833 B1 * | 5/2016 | Hung | ................ | H01L 29/4983 |
| 9,437,418 B2 * | 9/2016 | Possème | .......... | H01L 21/02126 |
| 9,660,079 B2 * | 5/2017 | Yamamoto | ............ | H01L 29/665 |
| 9,691,899 B2 * | 6/2017 | Zhu | ................ | H01L 21/823412 |
| 9,941,388 B2 * | 4/2018 | Cai | ................ | H01L 29/6656 |
| 2002/0102430 A1 * | 8/2002 | Shirahata | .......... | H01L 21/28247 428/629 |
| 2003/0011080 A1 * | 1/2003 | Deshpande | ..... | H01L 21/823864 438/184 |
| 2003/0045061 A1 * | 3/2003 | Kwon | ................ | H01L 29/6653 438/303 |
| 2004/0004424 A1 * | 1/2004 | Sakurai | ................ | G02B 6/0085 313/110 |
| 2004/0124450 A1 * | 7/2004 | Yeap | ................ | H01L 21/28273 257/288 |
| 2004/0132258 A1 * | 7/2004 | Jin | ...................... | H01L 29/6653 438/302 |
| 2005/0064635 A1 * | 3/2005 | Ajmera | ............ | H01L 21/02063 438/184 |
| 2005/0093075 A1 * | 5/2005 | Bentum | ........... | H01L 29/66545 257/368 |
| 2005/0112817 A1 * | 5/2005 | Cheng | ............. | H01L 21/823807 438/219 |
| 2005/0236694 A1 * | 10/2005 | Wu | ................... | H01L 21/02126 257/632 |
| 2005/0279997 A1 * | 12/2005 | Shin | ................. | H01L 21/02378 257/49 |
| 2006/0003533 A1 * | 1/2006 | Kammler | .......... | H01L 21/26506 438/300 |
| 2006/0246641 A1 * | 11/2006 | Kammler | ........ | H01L 21/823807 438/184 |
| 2006/0289856 A1 * | 12/2006 | Shimamune | ......... | H01L 29/045 257/19 |
| 2007/0077736 A1 * | 4/2007 | Yamaguchi | ....... | H01L 21/26506 438/510 |
| 2008/0061366 A1 * | 3/2008 | Liu | ................. | H01L 21/823807 257/336 |
| 2008/0142838 A1 * | 6/2008 | Ohta | ................ | H01L 21/823864 257/190 |

(56) References Cited

U.S. PATENT DOCUMENTS

| | | | |
|---|---|---|---|
| 2008/0157091 A1* | 7/2008 | Shin | H01L 29/6656 257/66 |
| 2008/0224212 A1* | 9/2008 | Lee | H01L 29/6653 257/344 |
| 2008/0272438 A1* | 11/2008 | Doris | H01L 21/28176 257/369 |
| 2009/0152634 A1* | 6/2009 | Grant | H01L 21/28114 257/368 |
| 2009/0256178 A1* | 10/2009 | Matsuo | H01L 29/0847 257/288 |
| 2009/0267119 A1* | 10/2009 | Tamura | H01L 21/823807 257/288 |
| 2010/0136762 A1* | 6/2010 | Beyer | H01L 21/28123 438/301 |
| 2010/0244155 A1* | 9/2010 | Carter | H01L 21/823807 257/410 |
| 2010/0301350 A1* | 12/2010 | Tamura | H01L 21/823807 257/77 |
| 2010/0320503 A1* | 12/2010 | Chong | H01L 29/66628 257/190 |
| 2011/0136307 A1* | 6/2011 | Ohta | H01L 21/823864 438/231 |
| 2011/0151674 A1* | 6/2011 | Tang | H01J 37/32357 438/715 |
| 2011/0159657 A1* | 6/2011 | Griebenow | H01L 21/823807 438/303 |
| 2011/0195550 A1* | 8/2011 | Chang | H01L 21/28079 438/230 |
| 2011/0198675 A1* | 8/2011 | Ng | H01L 21/823814 257/288 |
| 2011/0201164 A1* | 8/2011 | Chung | H01L 21/823807 438/229 |
| 2011/0316087 A1* | 12/2011 | Pidin | H01L 21/823807 257/369 |
| 2012/0025329 A1* | 2/2012 | Wu | H01L 21/823468 257/411 |
| 2012/0112281 A1* | 5/2012 | Pal | H01L 21/823807 257/347 |
| 2012/0119307 A1* | 5/2012 | Li | H01L 21/76816 257/410 |
| 2012/0161243 A1* | 6/2012 | Kronholz | H01L 21/31116 257/369 |
| 2012/0213940 A1* | 8/2012 | Mallick | C23C 16/345 427/535 |
| 2012/0223364 A1* | 9/2012 | Chung | H01L 21/823807 257/192 |
| 2012/0267683 A1* | 10/2012 | Kronholz | H01L 21/823807 257/192 |
| 2013/0032887 A1* | 2/2013 | He | H01L 21/823807 257/369 |
| 2013/0037866 A1* | 2/2013 | Thees | H01L 21/823468 257/288 |
| 2013/0052779 A1* | 2/2013 | Flachowsky | H01L 21/823807 438/229 |
| 2013/0157432 A1* | 6/2013 | Beyer | H01L 21/28123 438/299 |
| 2013/0178053 A1* | 7/2013 | Li | H01L 21/76816 438/586 |
| 2013/0196495 A1* | 8/2013 | Flachowsky | H01L 29/6653 438/585 |
| 2013/0248950 A1* | 9/2013 | Kang | H01L 29/78 257/288 |
| 2013/0320550 A1* | 12/2013 | Kim | H01L 21/76897 257/773 |
| 2013/0328112 A1* | 12/2013 | Xie | H01L 29/6653 257/288 |
| 2014/0070285 A1* | 3/2014 | Xie | H01L 29/66545 257/288 |
| 2014/0073096 A1* | 3/2014 | Chung | H01L 21/823807 438/222 |
| 2014/0073097 A1* | 3/2014 | Chung | H01L 21/823807 438/229 |
| 2014/0087535 A1* | 3/2014 | Roh | H01L 21/823412 438/285 |
| 2014/0099767 A1* | 4/2014 | Maekawa | H01L 21/26513 438/305 |
| 2014/0106522 A1* | 4/2014 | Tsai | H01L 21/26586 438/198 |
| 2014/0131804 A1* | 5/2014 | Chen | H01L 21/823425 257/368 |
| 2014/0141589 A1* | 5/2014 | Shin | H01L 29/66568 438/306 |
| 2014/0151759 A1* | 6/2014 | Loubet | H01L 29/06 257/288 |
| 2014/0175562 A1* | 6/2014 | Wang | H01L 21/76837 257/401 |
| 2014/0183663 A1* | 7/2014 | Song | H01L 21/265 257/408 |
| 2014/0239939 A1* | 8/2014 | Leprettre | G01R 19/2513 324/86 |
| 2015/0028399 A1* | 1/2015 | Xiong | H01L 29/41725 257/288 |
| 2015/0035074 A1* | 2/2015 | Obradovic | H01L 29/41791 257/369 |
| 2015/0084102 A1* | 3/2015 | Park | H01L 29/785 257/288 |
| 2015/0126012 A1* | 5/2015 | Jeong | H01L 29/66628 438/300 |
| 2015/0179654 A1* | 6/2015 | Mehrotra | H01L 27/1104 257/77 |
| 2015/0187660 A1* | 7/2015 | Patzer | H01L 21/823864 438/217 |
| 2015/0228546 A1* | 8/2015 | Huang | H01L 21/823864 257/369 |
| 2015/0228754 A1* | 8/2015 | Sung | H01L 29/6656 438/595 |
| 2015/0372108 A1* | 12/2015 | Cai | H01L 29/6656 257/401 |
| 2016/0056262 A1* | 2/2016 | Ho | H01L 29/66545 257/288 |
| 2016/0079420 A1* | 3/2016 | Liu | H01L 29/6653 257/369 |
| 2016/0111538 A1* | 4/2016 | Roh | H01L 21/823412 257/192 |
| 2016/0126146 A1* | 5/2016 | Hoentschel | H01L 21/823864 257/336 |
| 2016/0133728 A1* | 5/2016 | Jang | H01L 29/66545 438/283 |
| 2016/0149017 A1* | 5/2016 | Tsai | H01L 29/66636 257/288 |
| 2016/0163601 A1* | 6/2016 | Xie | H01L 21/28088 257/392 |
| 2016/0204258 A1* | 7/2016 | Yamamoto | H01L 29/665 257/194 |
| 2016/0218040 A1* | 7/2016 | Maekawa | H01L 21/26513 |
| 2016/0293715 A1* | 10/2016 | Zang | H01L 29/4991 |
| 2017/0092769 A1* | 3/2017 | Roh | H01L 21/823412 |
| 2017/0231885 A1* | 8/2017 | Cremers | A61K 9/0014 514/552 |
| 2017/0365604 A1* | 12/2017 | Suh | H01L 27/0924 |
| 2018/0151716 A1* | 5/2018 | Fung | H01L 29/6653 |
| 2018/0190785 A1* | 7/2018 | Hung | H01L 29/4983 |
| 2018/0350937 A1* | 12/2018 | Hung | H01L 29/4983 |

OTHER PUBLICATIONS

Final Office Action dated Feb. 23, 2017 in U.S. Appl. No. 14/309,096; now issued as U.S. Pat. No. 9,941,388.

Non-Final Office Action dated Jun. 19, 2017 in U.S. Appl. No. 14/309,096; now issued as U.S. Pat. No. 9,941,388.

Final Office Action dated Oct. 4, 2017 in U.S. Appl. No. 14/309,096; now issued as U.S. Pat. No. 9,941,388.

* cited by examiner

METHOD AND STRUCTURE FOR PROTECTING GATES DURING EPITAXIAL GROWTH

FIELD OF THE INVENTION

The present invention relates generally to semiconductor fabrication, and more particularly, to methods and structures for protecting gates during epitaxial growth.

BACKGROUND

Complementary metal-oxide semiconductor (CMOS) field-effect transistors (FETs) are used in many integrated circuit applications, such as signal processing, computing, and wireless communications. CMOS chips in manufacturing comprise planar thick-body devices on bulk Si substrates or silicon-on-insulator (SOI) substrates. Fin type field effect transistor (finFET) devices are becoming more popular as critical dimensions continue to reduce. To enhance carrier mobility, stressor regions may be formed adjacent the gate and channel of the transistor. However, the deposition of stressor regions can cause problems that can adversely affect product yield. It is therefore desirable to have improvements in methods and structures to mitigate these problems.

SUMMARY

Embodiments of the present invention provide methods and structures for protecting gates during epitaxial growth. An inner spacer of a first material is deposited adjacent a transistor gate. An outer spacer of a different material is deposited adjacent the inner spacer. Stressor cavities are formed adjacent the transistor gate. The inner spacer is recessed, forming a divot. The divot is filled with a material to protect the transistor gate. The stressor cavities are then filled. As the gate is safely protected, unwanted epitaxial growth ("mouse ears") on the transistor gate is prevented.

In a first aspect, embodiments of the present invention provide a method of forming a semiconductor structure, comprising: forming a first gate and a second gate on a semiconductor structure; forming a hardmask layer on the first gate and the second gate; forming inner spacers adjacent the first gate and the second gate; forming outer spacers adjacent the inner spacers; masking the first gate; forming stressor cavities adjacent the second gate; recessing a portion of the inner spacers of the second gate to form divots; filling the divots with a dielectric material; and filling the stressor cavities with a stressor material.

In a second aspect, embodiments of the present invention provide a semiconductor structure, comprising: a semiconductor substrate; a transistor gate disposed on the semiconductor substrate; a lower inner spacer disposed adjacent a lower portion of the transistor gate; an upper inner spacer disposed adjacent an upper portion of the transistor gate and in contact with the lower inner spacer; and an outer spacer disposed adjacent to the lower inner spacer and the upper inner spacer.

In a third aspect, embodiments of the present invention provide a semiconductor structure, comprising: a semiconductor substrate; a first transistor gate and a second transistor gate disposed on the semiconductor substrate; a full inner spacer disposed adjacent the first transistor gate; an outer spacer disposed adjacent the full inner spacer; a lower inner spacer disposed adjacent a lower portion of the second transistor gate; an upper inner spacer disposed adjacent an upper portion of the second transistor gate and in contact with the lower inner spacer; and an outer spacer disposed adjacent the lower inner spacer and upper inner spacer of the second transistor gate.

BRIEF DESCRIPTION OF THE DRAWINGS

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

Furthermore, certain elements in some of the figures may be omitted, or illustrated not-to-scale, for illustrative clarity. The cross-sectional views may be in the form of "slices", or "near-sighted" cross-sectional views, omitting certain background lines, which would otherwise be visible in a "true" cross-sectional view, for illustrative clarity. Furthermore, for clarity, some reference numbers may be omitted in certain drawings.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, are interchangeable and specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," "some embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment. It will be understood that one skilled in the art may cross embodiments by "mixing and matching" one or more features of one embodiment with one or more features of another embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, unless otherwise noted, "depositing" or "filling" may include any now known or later developed techniques appropriate for the material to be deposited including, but not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

Figure 1:
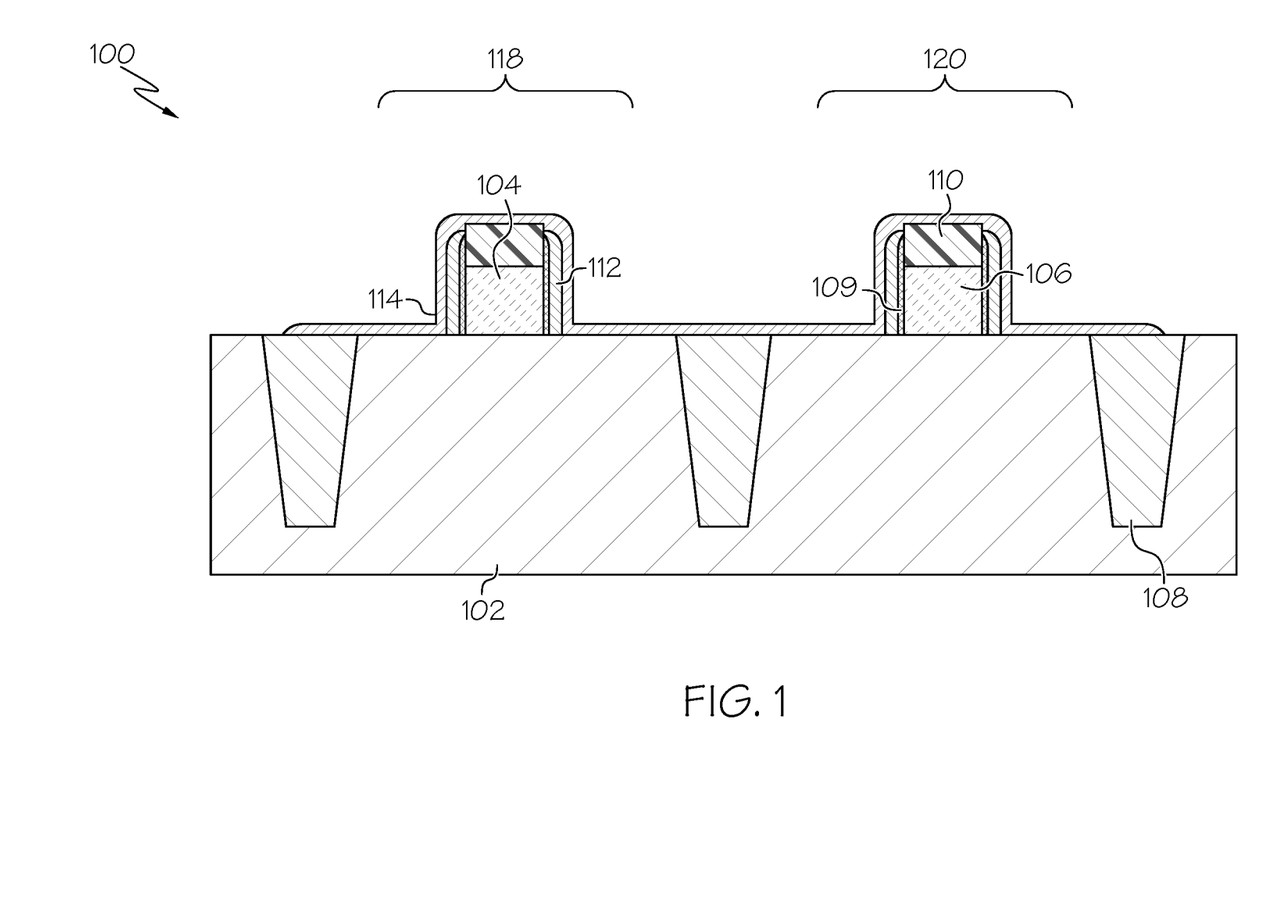
FIG. 1 shows a semiconductor structure at a starting point for embodiments of the present invention.

FIG. 1 shows a semiconductor structure at a starting point for embodiments of the present invention. The semiconductor structure 100 is a complementary metal oxide semiconductor (CMOS), comprising an N-type field effect transistor (NFET) 118 and a P-type field effect transistor (PFET) 120. It should be recognized that embodiments of the present invention may include planar devices in addition to fin type field effect transistors (finFETs).

The semiconductor structure 100 comprises a substrate 102. The term "substrate" as used herein is intended to include a semiconductor substrate, a semiconductor epitaxial layer deposited or otherwise formed on a semiconductor substrate, and/or any other suitable type of semiconductor body, and all such structures are contemplated as falling within the scope of the present invention. For example, the semiconductor substrate may comprise a semiconductor wafer (e.g., silicon, silicon germanium (SiGe), or a silicon-on-insulator (SOI) wafer) or one or more die on a wafer, and any epitaxial layers or other type semiconductor layers formed thereover or associated therewith. The semiconductor substrate may be doped, undoped, or contain doped regions and undoped regions therein. The semiconductor substrate may contain regions with strain and regions without strain therein, or contain regions of tensile strain and compressive strain.

A first gate 104 and a second gate 106 are each formed on the substrate 102 of the semiconductor structure 100. In embodiments, the gates may be polysilicon gates. "Transistor gate" and "gate" shall have the same meaning, and are used interchangeably herein. In some embodiments, the gates may be metal gates formed by a replacement metal gate (RMG) process. Shallow trench isolation (STI) regions 108 may be formed in the substrate 102. In embodiments, the STIs 108 may be silicon oxide or other suitable material. A liner 109 may be formed on the sides of the gates 104 and 106. In embodiments, the liner 109 may be comprised of silicon nitride. Inner spacers 112 are formed adjacent the first gate 104 and the second gate 106. In some embodiments, inner spacers 112 are silicon oxide, or other suitable material. Outer spacers 114 are formed adjacent the inner spacers 112. In some embodiments, outer spacers 114 may be silicon nitride, or other suitable material. A pad nitride layer 110 is disposed on the gates 104 and 106.

Figure 2:
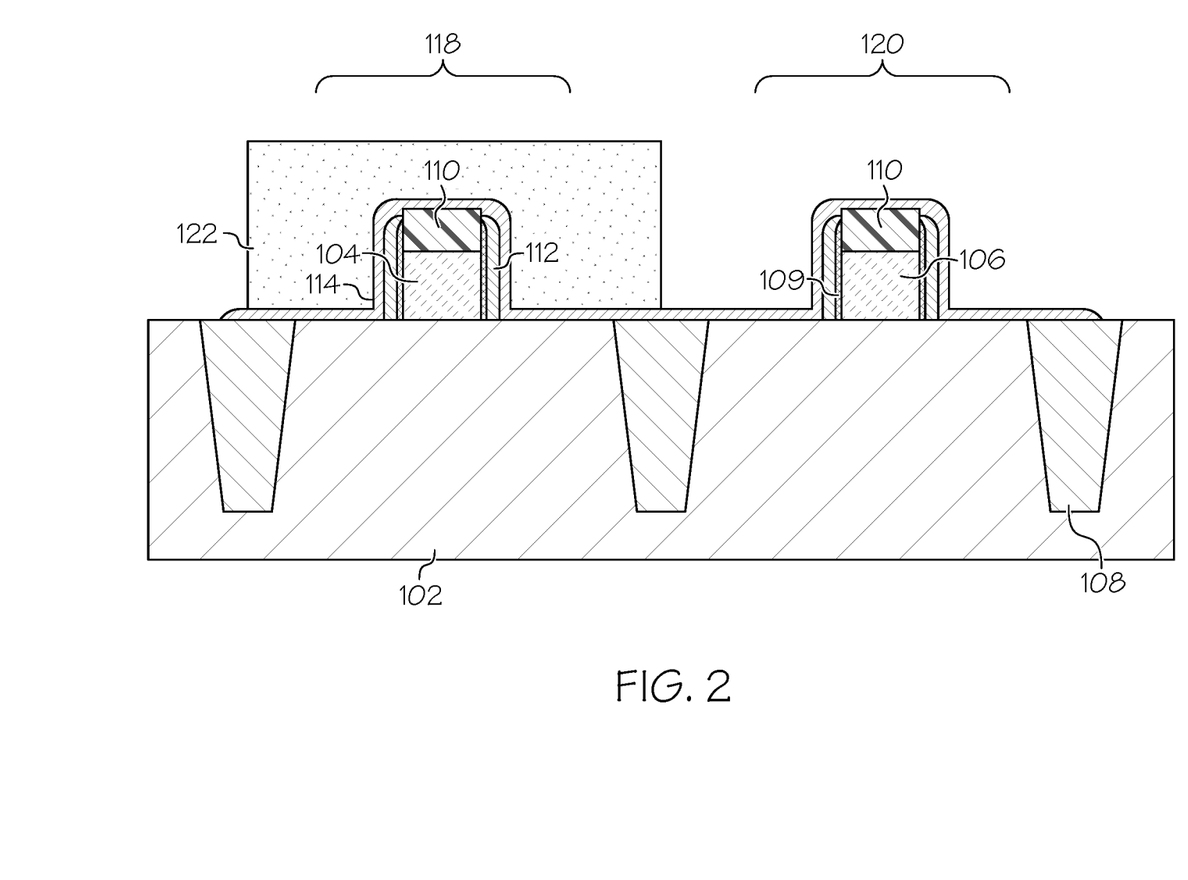
FIG. 2 shows a semiconductor structure after a subsequent process step of masking a transistor.

FIG. 2 shows a semiconductor structure after a subsequent process step of masking a transistor. A mask 122 is deposited over the NFET transistor 118. In embodiments, mask 122 may be SiO2, or other suitable material. Mask 122 may be formed by standard lithographic/patterning techniques. In other embodiments, mask 122 could be deposited over PFET transistor 120, and the process proceeds with respect to the first gate 104 instead of the second gate 106 as described herein. The mask 122 is later removed once processing on the non-masked transistor is completed.

Figure 3:
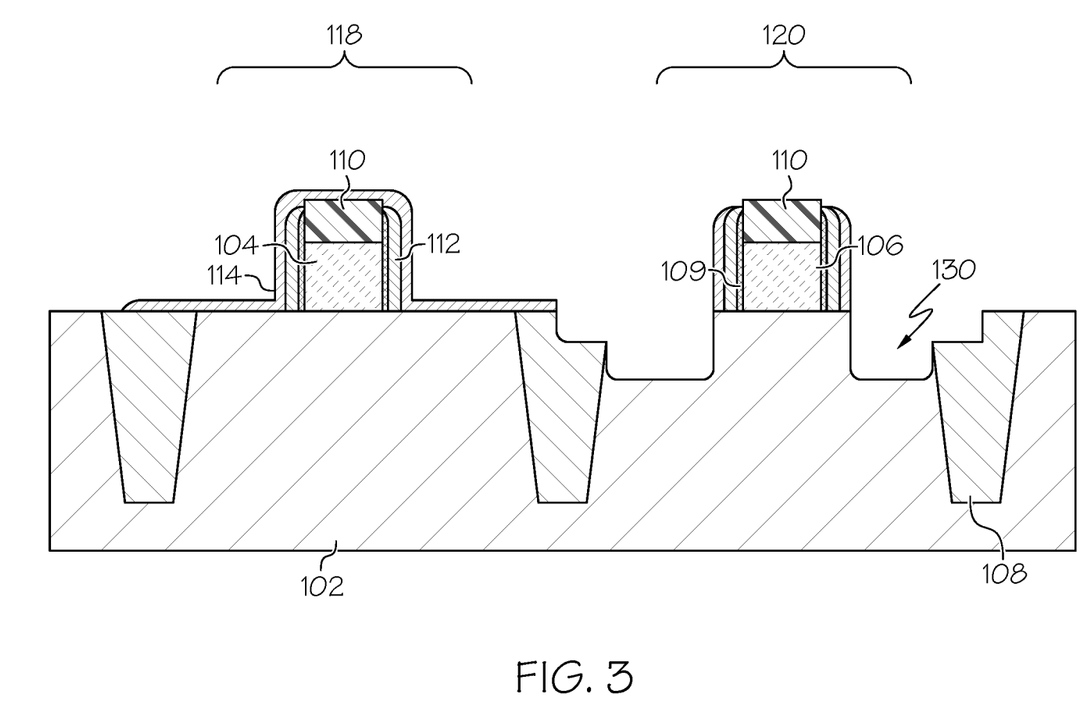
FIG. 3 shows a semiconductor structure after a subsequent process step of forming stressor cavities.

FIG. 3 shows a semiconductor structure after a subsequent process step of forming stressor cavities. Stressor cavities 130 are formed in the substrate 102 adjacent the second gate 106. In embodiments, stressor cavities 130 may be formed by reactive ion etch (RIE), wet etch techniques, or a combination thereof.

Figure 4:
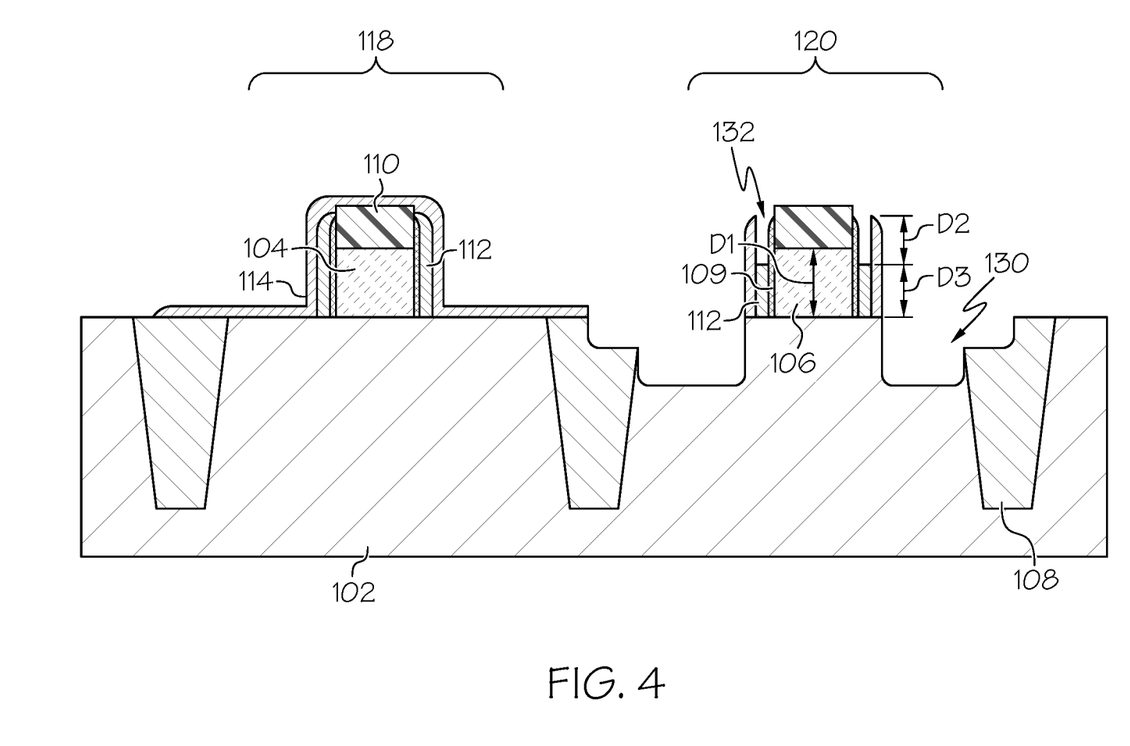
FIG. 4 shows a semiconductor structure after a subsequent process step of forming divots.

FIG. 4 shows a semiconductor structure after a subsequent process step of forming divots. A portion of the inner spacers 112 of the second gate 106 is recessed to form divots 132. The outer spacers 114 remain intact during this process. Any of a number of processes may be used to form the divots 132, including, but not limited to, reactive ion etch (RIE), wet etch, chemical oxide removal (COR) process, or Siconi™ etch process. The recess technique is typically selective such that only the material of the inner spacer 112 is recessed. In embodiments, D1 may range from about 100 nanometers to about 200 nanometers. D2 may range from about 5 to 50 percent of D1, and the sum of D2 and D3 equals D1.

Figure 5:
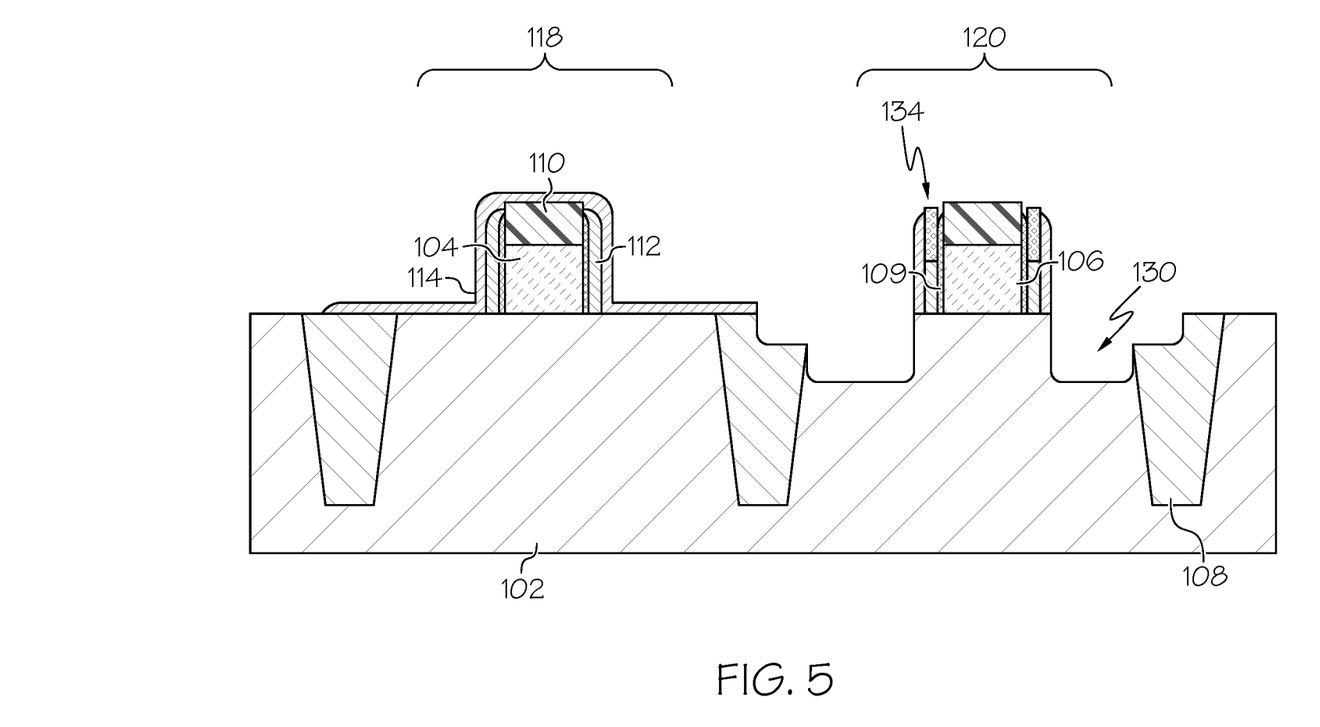
FIG. 5 shows a semiconductor structure after a subsequent process step of filling the divots.

FIG. 5 shows a semiconductor structure after a subsequent process step of filling the divots. The divots 132 are filled with a dielectric material to form an upper spacer 134. The divots 132 are filled with an epitaxial growth inhibiting material to form an upper spacer 134. The epitaxial growth inhibiting material may include a dielectric, for example, but not limited to silicon nitride, silicon carbon nitride, and/or silicon oxycarbide. In embodiments, atomic layer deposition (ALD) may be used to fill divots 132 with the epitaxial growth inhibiting material, such as silicon nitride (or, in some embodiments, SiCN or SiOC). After the divots 132 are filled, a recess (etch back) is performed to make the upper spacer 134 substantially of similar height to outer spacers 114, and expose the silicon substrate 102 of the PFET transistor 120 for stressor region growth.

Figure 6:
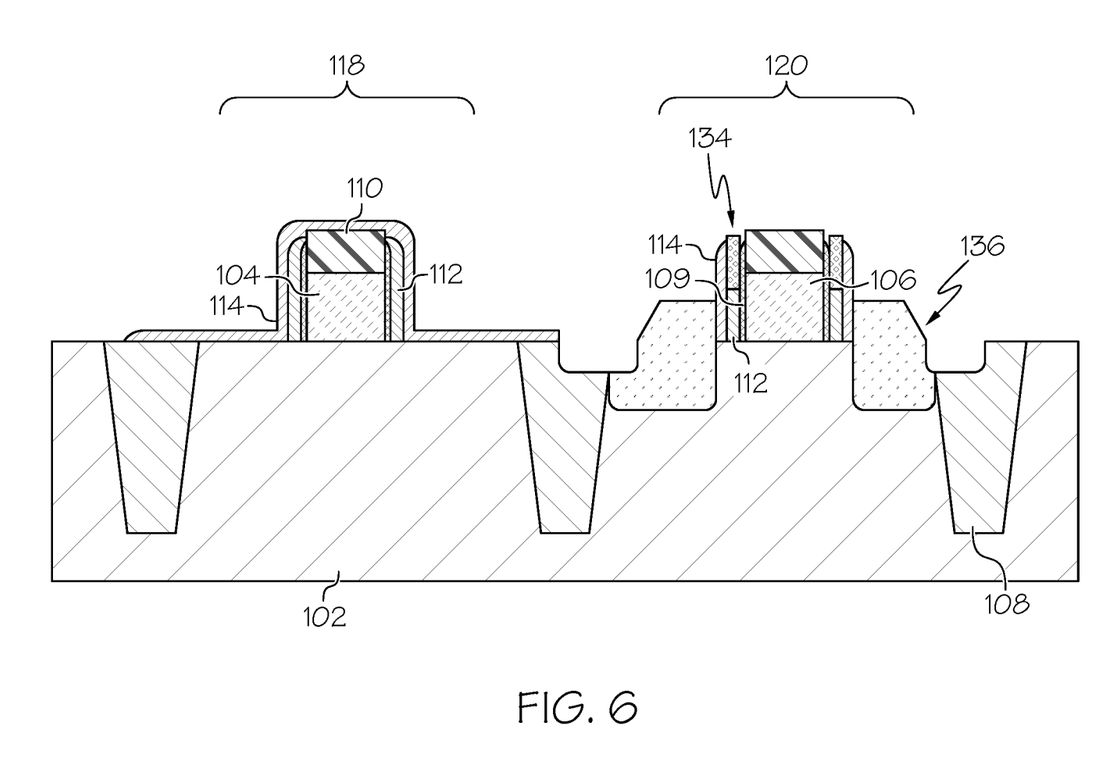
FIG. 6 shows a semiconductor structure after a subsequent process step of filling the stressor cavities.

FIG. 6 shows a semiconductor structure after a subsequent process step of filling the stressor cavities. The stressor cavities 130 are filled with a stressor material 136. In embodiments, stressor material 136 may be epitaxially-grown silicon germanium (eSiGe), or other suitable material. The second gate 106 is now safely protected during formation of stressor region (i.e., 136), thus preventing unwanted growth of the stressor region 136. This unwanted growth is also known as "mouse ear". This occurs when a portion of a gate is exposed during formation of an epitaxial stressor region. Embodiments of the present invention prevent such exposure of the gate, thereby preventing the unwanted growth (mouse ear).

As shown in FIG. 6, an embodiment of the invention comprises a semiconductor substrate 102, having a transistor gate 106. A portion of inner spacer 112 remains, comprising a (lower) inner spacer 112, disposed adjacent a lower portion of the transistor gate 106. Filled divot is an upper inner spacer 134 that is disposed adjacent to an upper portion of the transistor gate 106 and in contact with the lower inner spacer 112. An outer spacer 114 is disposed adjacent the upper inner spacer 134 and the lower inner spacer 112.

In addition, an embodiment of the invention may comprise another transistor gate 104 disposed on the semiconductor substrate 102. A full inner spacer 112 is disposed adjacent the transistor gate 104. An outer spacer 114 is disposed adjacent the full inner spacer.

In embodiments, the lower inner spacer comprises silicon oxide. In embodiments, the upper inner spacer may be silicon nitride, silicon carbon nitride, silicon oxycarbide, and/or another suitable material. In embodiments, the outer spacer may be silicon nitride or other suitable material.

Figure 7:
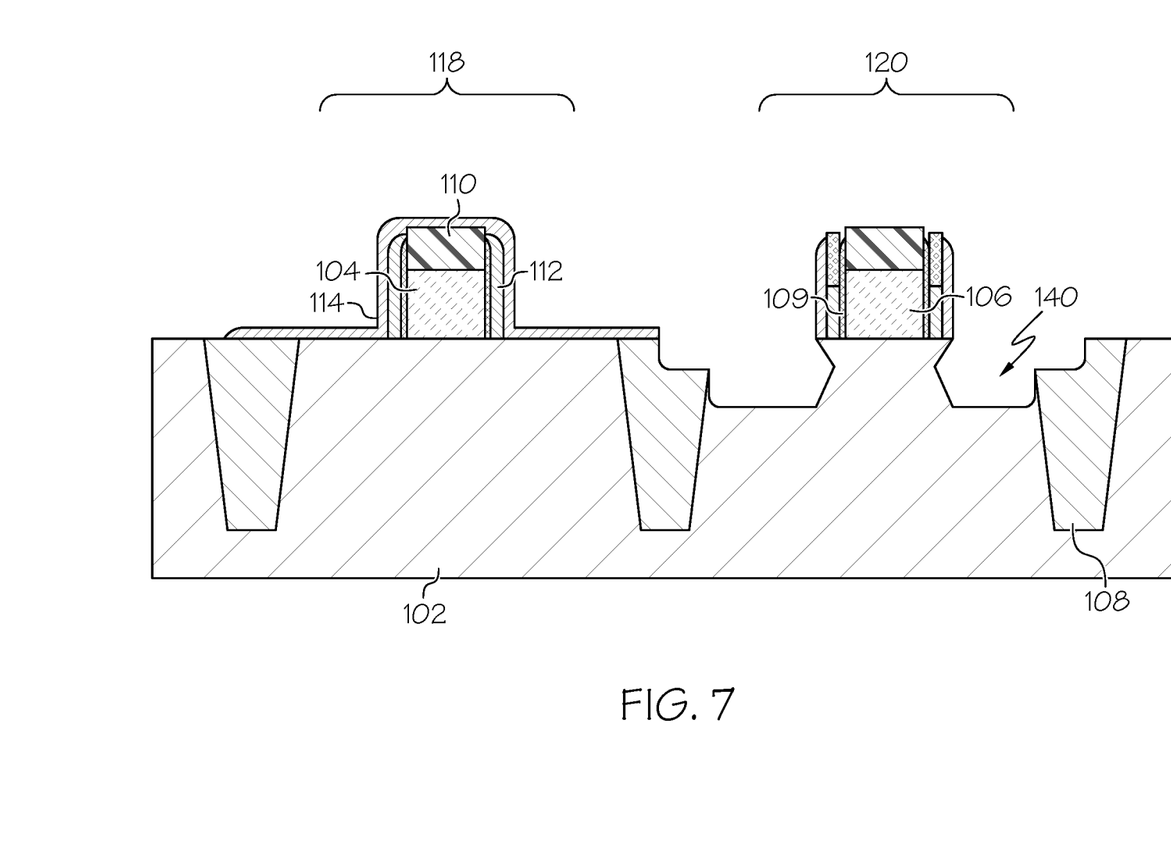
FIG. 7 shows a semiconductor structure after a subsequent process step of forming sigma stressor cavities in accordance with an alternative embodiment.

FIG. 7 shows a semiconductor structure after a subsequent process step of forming sigma stressor cavities in accordance with an alternative embodiment. In an alternative embodiment, the stressor cavities are sigma cavities 140. The sigma cavities 140 may be formed in the substrate 102 under the second gate 106 of the PFET transistor 120. The sigma cavities 140 may be formed by a wet etch, RIE, or combination thereof.

Figure 8:
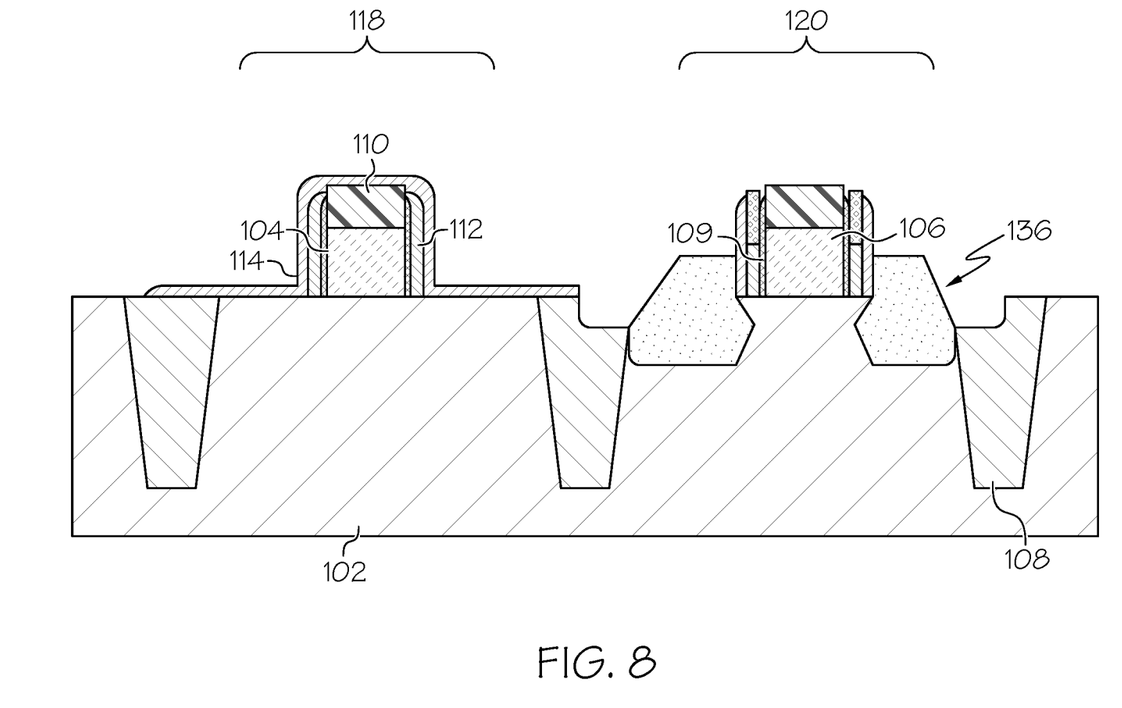
FIG. 8 shows a semiconductor structure after a subsequent process step of filling sigma stressor cavities in accordance with an alternative embodiment.

FIG. 8 shows a semiconductor structure after a subsequent process step of filling sigma stressor cavities in accordance with the alternative embodiment. The stressor material 136 (e.g., eSiGe) is deposited into the stressor cavities 140. The gate 106 is now safely protected during formation of stressor region 136.

Figure 9:
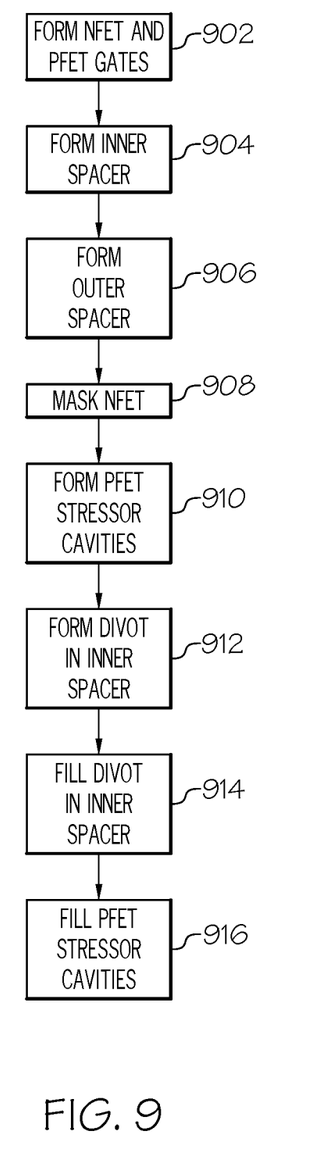
FIG. 9 is a flowchart indicating process steps for embodiments of the present invention.

FIG. 9 is a flowchart indicating process steps for embodiments of the present invention. At 902, a first gate and a second gate are formed on a semiconductor structure. At 904, a hardmask layer is formed on the first gate and the second gate. At 906, inner spacers are formed adjacent the first gate and the second gate. At 906, outer spacers are formed adjacent the inner spacers. At 908, the first gate is masked. At 910, stressor cavities are formed adjacent the second gate. In some embodiments, the cavities can be sigma cavities as illustrated at FIG. 7. At 912, a portion of the inner spacers of the second gate are recessed to form divots. At 914, the divots are filled with an epitaxial growth inhibiting material to form an upper spacer. At 916, stressor cavities are filled with a stressor material.

While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A semiconductor structure, comprising:
   a semiconductor substrate;
   a transistor gate disposed on the semiconductor substrate;
   a lower inner spacer disposed adjacent to a lower portion of the transistor gate, wherein a top of the lower inner spacer is below a top of the transistor gate;
   an upper inner spacer disposed adjacent to an upper portion of the transistor gate, in contact with the lower inner spacer, and not in contact with a top of the transistor gate;
   an outer spacer disposed adjacent to the lower inner spacer and the upper inner spacer;
   a stressor cavity formed in the semiconductor substrate adjacent to the transistor gate; and
   a stressor material disposed in the stressor cavity, in contact with the outer spacer and not in contact with the lower inner spacer.

2. The semiconductor structure of claim 1, wherein the transistor gate comprises polysilicon.

3. The semiconductor structure of claim 1, wherein the lower inner spacer comprises silicon oxide.

4. The semiconductor structure of claim 1, wherein the upper inner spacer comprises silicon nitride.

5. The semiconductor structure of claim 1, wherein the upper inner spacer comprises silicon carbon nitride.

6. The semiconductor structure of claim 1, wherein the upper inner spacer comprises silicon oxycarbide.

7. The semiconductor structure of claim 1, wherein the outer spacer comprises silicon nitride.

8. The semiconductor structure of claim 1, wherein the stressor material comprises silicon germanium.

9. The semiconductor structure of claim 1, wherein the stressor cavity comprises a sigma cavity.

10. A semiconductor structure, comprising:
    a semiconductor substrate;
    a first transistor gate and a second transistor gate disposed on the semiconductor substrate, wherein the first transistor gate and the second transistor gate each comprise a liner formed on the sides of the gate;
    a full inner spacer disposed in contact with the liner on the side of the first transistor gate;
    an outer spacer disposed adjacent to the full inner spacer;
    a lower inner spacer disposed in contact with the liner on the side of a lower portion of the second transistor gate, wherein a top of the lower inner spacer is below a top of the second transistor gate;
    an upper inner spacer disposed in contact with the liner on the side of an upper portion of the second transistor gate, in contact with the top of the lower inner spacer, and not in contact with a side of the lower inner spacer;
    an outer spacer disposed in contact with both the lower inner spacer and the upper inner spacer of the second transistor gate; and
    a stressor material having a bottom below a bottom of the second transistor gate, wherein the stressor material is in contact with a side of the outer spacer disposed in contact with both the lower inner spacer and the upper inner space of the second transistor gate.

11. The semiconductor structure of claim 10, wherein the lower inner spacer comprises silicon oxide.

12. The semiconductor structure of claim 10, wherein the upper inner spacer comprises silicon nitride.

13. The semiconductor structure of claim 10, wherein the upper inner spacer comprises silicon carbon nitride.

14. The semiconductor structure of claim 10, wherein the upper inner spacer comprises silicon oxycarbide.

\* \* \* \* \*